United States Patent [19]
Mabboux et al.

[11] Patent Number: 5,502,278
[45] Date of Patent: Mar. 26, 1996

[54] ENCASED ELECTRONIC CIRCUIT WITH CHIP ON A GRID ZONE OF CONDUCTIVE CONTACTS

[75] Inventors: Henri Mabboux, Saint Martin le Vinoux; Michel Mermet-Guyennet, Saint Egreve, both of France

[73] Assignee: Thomson Composants Militaires et Spatiaux, Courbevoie, France

[21] Appl. No.: 132,701

[22] Filed: Oct. 6, 1993

Related U.S. Application Data

[63] Continuation of Ser. No. 640,387, Jan. 23, 1991, abandoned.

[30] Foreign Application Priority Data

May 30, 1989 [FR] France .................................. 89 07091

[51] Int. Cl.$^6$ ............................. H01L 23/02; H01R 9/00
[52] U.S. Cl. ....................... 174/52.4; 174/261; 361/772; 361/775; 257/678; 257/691; 257/700
[58] Field of Search ..................... 361/729–730, 361/760–764, 791, 807, 808, 772, 774, 775; 174/255, 256, 52.2, 52.3, 52.4, 257, 261; 257/678, 690–691, 700

[56] References Cited

U.S. PATENT DOCUMENTS

| | | | |
|---|---|---|---|
| 4,608,592 | 8/1986 | Miyamoto | 174/52.4 |
| 4,638,348 | 1/1987 | Brown et al. | |
| 4,672,421 | 6/1987 | Lin | 361/765 |

*Primary Examiner*—Bot L. Ledynh
*Attorney, Agent, or Firm*—Roland Plottel

[57] ABSTRACT

The invention relates to the encapsulation of integrated circuits, and more particularly encapsulation in a multi-layer ceramic case. In order to permit the disposition of chips of variable size on a monolithic chip (22, 24, 26) reception site (23, 25, 27) without the risk of having excessively long connection wires between the chip and the conductive regions (44) surrounding the reserved site, it is proposed according to the invention to cover the chip-reception site with a number of mutually insulated conductive contacts which can serve as soldering relays for these connection wires (80, 90, 100). If the chip is large (chip 24) it is bonded or soldered to these contacts; if it is small (chip 22) it is surrounded by relay-contacts.

8 Claims, 4 Drawing Sheets

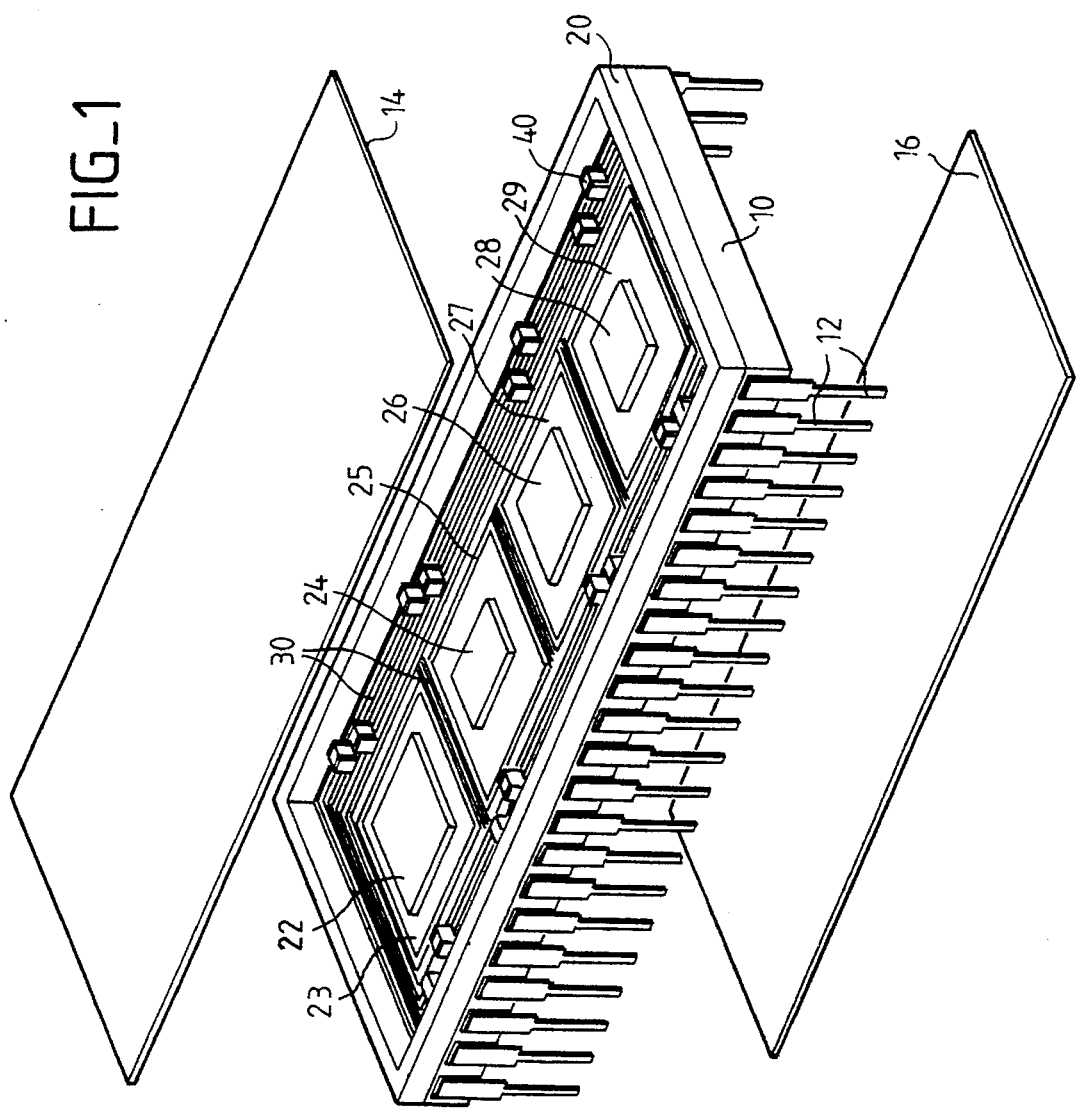

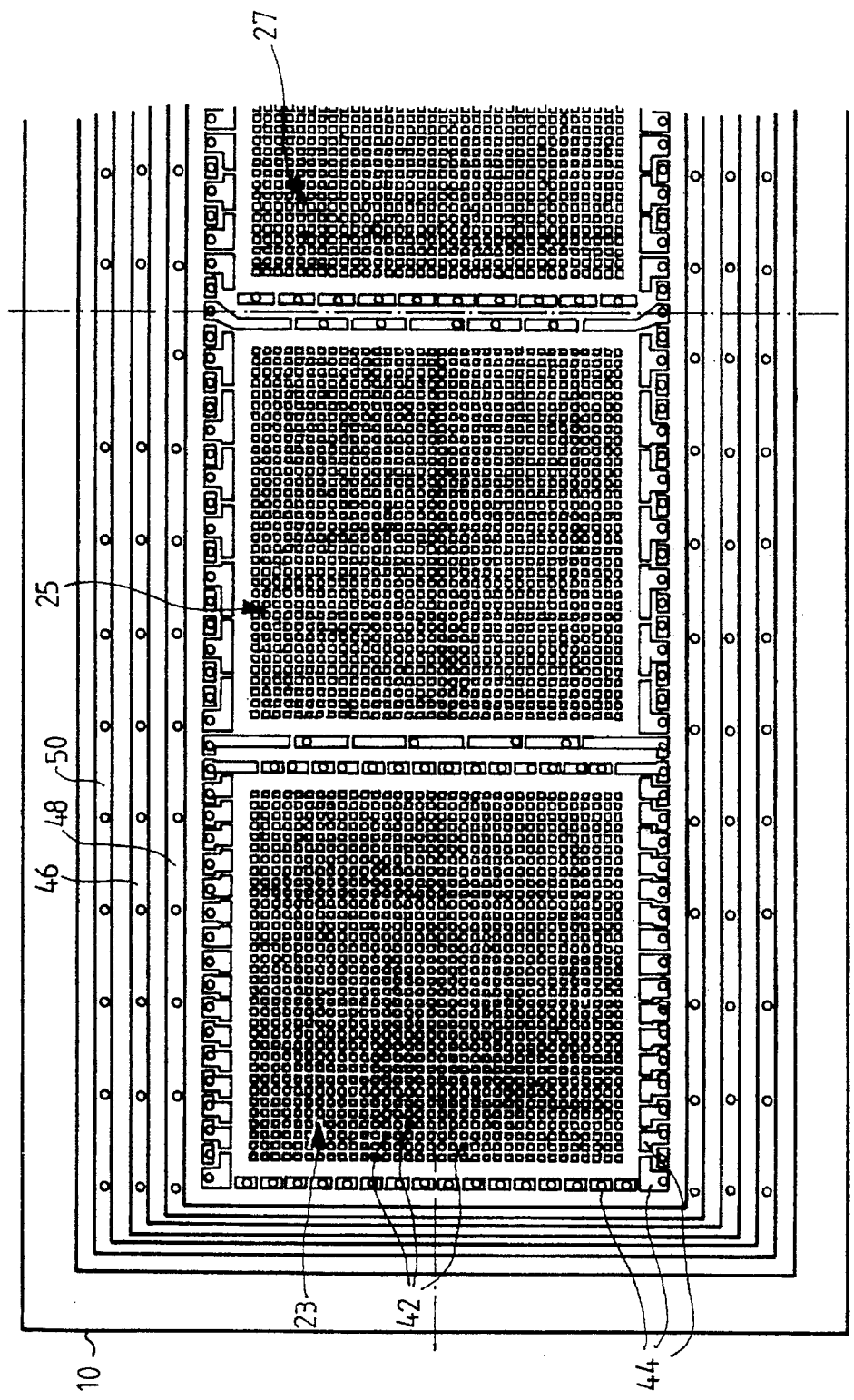
FIG_2

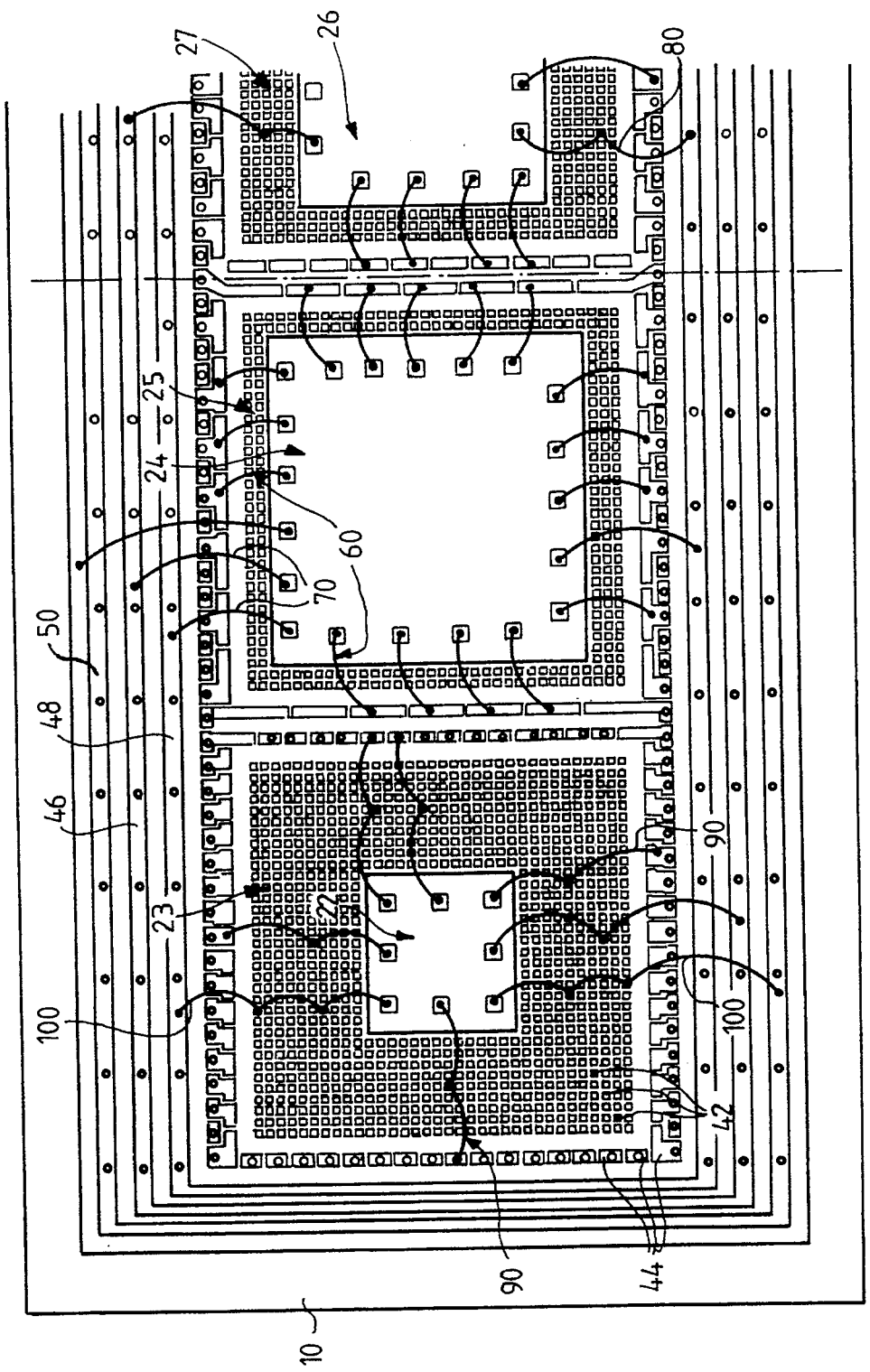
FIG_3

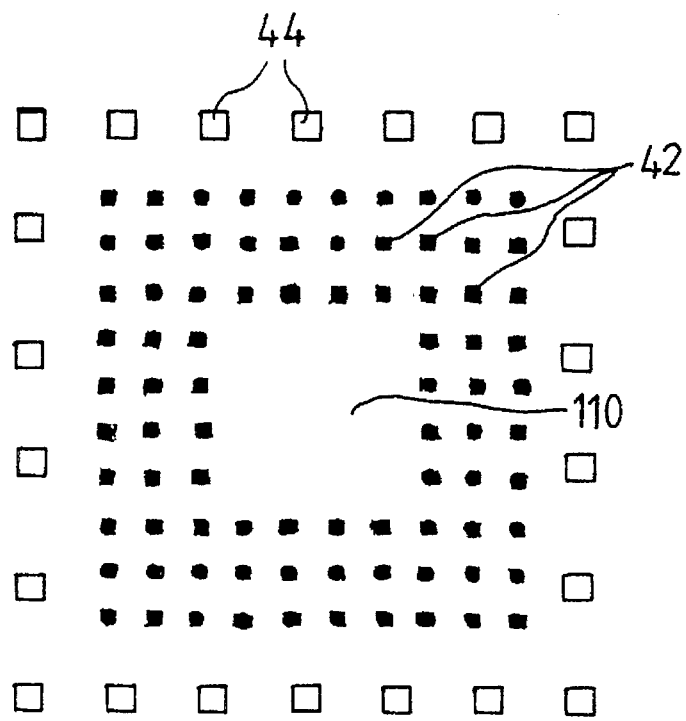
FIG_4-a
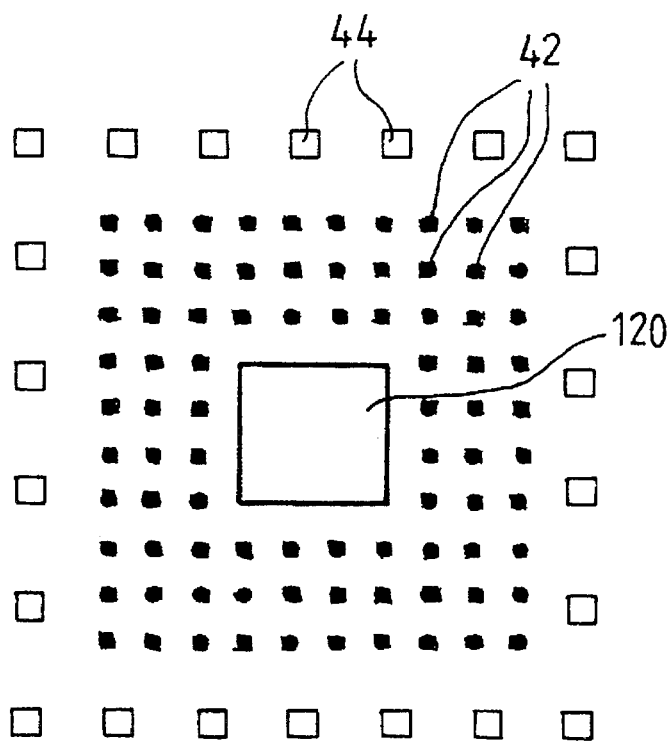
FIG_4-b

ENCASED ELECTRONIC CIRCUIT WITH CHIP ON A GRID ZONE OF CONDUCTIVE CONTACTS

This application is a continuation of application Ser. No. 07/640,387, filed Jan. 23, 1991 now abandoned.

The invention relates to cases for encapsulation of integrated circuits. It is most particularly applicable to multi-layer ceramic cases and will be described in greater detail in relation to such a type of case, although its application to other types of case may also be envisaged.

A multi-layer ceramic case is represented by way of example in FIG. 1. It is a case intended to receive several integrated circuit chips; these chips are mounted on a ceramic substrate 10 on which are soldered external connection pins 12; the case is closed by an upper cover 14 and a lower cover 16. The substrate can carry chips on the top surface and chips on the bottom surface. The chips of the top surface are housed in a cavity whose back is constituted by the upper face of the substrate, and the edges are constituted by a collar 20, which, in this example, is a metal collar (made from ion-cobalt-nickel alloy for example).

In the example represented, the case can comprise up to four integrated circuit chips 22, 24, 26, 28 on the upper face, sites 23, 25, 27, 29 being reserved for each of the chips respectively. There is likewise provision for chips on respective sites of the lower face of the substrate; they have not been represented.

Conductors 30 are silk-screen printed onto the lower face and onto the upper face of the substrate; conductors are likewise silk-screen printed on to the inner layers of the substrate, since a multi-layer ceramic substrate is constituted by a stack of cofined silk-screen printed ceramic sheets. Capacitors 40 (for decoupling the power supplies) can be directly soldered on to the conductors on the surface of the substrate.

One of the aims of the invention is to make a case which may receive chips of variable size on the reserved sites. In fact, it is desired that a same case may serve in several different applications, that is to say in electronic circuits with several chips, the chips of which can differ not only in their function, but also in their size and their number of input/output contacts.

One of the reasons for wanting cases adaptable to several applications is the saving of time which can be obtained if a new case does not have to be redesigned and refabricated for each application; the design of a new case, the fabrication of the tooling for cutting sheets of unfired ceramic, and for piercing these sheets, the fabrication of the silk-screen printing tools, the making of sheets of unfired ceramic and their silk-screen printing, the firing, the mounting of the chips, and testing in fact take several months and it would be desirable to eliminate a good portion of this delay.

Unfortunately, it has been noticed that there was difficulty in adapting chips of different size to a reserved site. The reserved site is a zone on which a chip can be bonded or soldered. The maximum size of chip which can be placed on this site is evidently directly related to the size of the site. This site is surrounded by conductive connection regions onto which wires for connection with the chip can be soldered according to the conventional so-called "wire-bonding" technique. These conductive regions are silk-screen printed onto the substrate and are connected to conductors silk-screen printed onto the faces of the substrate or in the inner layers of the latter.

If the chip which is placed on the reserved site has a maximum size, there is no problem in soldering connection wires between the chip and the conductive connection regions.

However if the chip is smaller, and most particularly if it is very small relative to the site, rather long connection wires must be used between the chip and the conductive regions. Now long wires are more fragile; furthermore they are not rigid (by their very nature); the longer they are the more sensitive they are to vibrations, and the worse is their mechanical resistance to accelerations. There is in particular a significant risk of a short-circuit between neighbouring wires subjected to vibrations (the wires are uninsulated aluminum or gold wires).

The aim of the present invention is to propose a means to permit placement of chips of variable size on a site of fixed size without encountering the disadvantage just mentioned.

According to the invention, there is proposed an electronic circuit encapsulated in a case which comprises a monolithic chip-reception site, this site comprising an array of several mutually electrically insulated contacts disposed in such a way that, on the one hand, the chip can be bonded or soldered to these contacts if it has a maximum size permitted by the area of the site, and on the other hand, contacts surround the chip if it has a size smaller than this maximum size. These contacts are contacts serving as soldering relays; they are made of a material compatible with the soldering used in the connections between the chips and the case. They are in principle conductive contacts.

In principle, the site reserved for the monolithic chip is surrounded by conductive connection regions and mutually insulated contacts will be formed (normally by silk-screen printing) between the chip and the conductive regions.

Connection wires between the chip and the conductive regions will then be able to be soldered either directly between the chip and the conductive regions if the distance is small, or between the chip and an insulated contact from where the wire will set off again towards another contact or towards the conductive region.

Each contact is then able to form an intermediate relay site for a connection wire going from the chip to a conductive region. The contacts are therefore made in a material allowing such a soldering, it being best to make them in the same material as the conductive regions (tungsten, nickel, gold alloy for example); they are made in part during the silk-screen printing of the sheets of unfired ceramic and form part of the pattern of conductors silk-screen printed onto the surface layers (lower and upper) of the substrate 10.

Provision can be made for the contacts to be distributed over the whole area of the site reserved for chip; they can also be distributed only over the periphery of this site, the central portion of the site being able to be totally devoid of conductive layer or being able to be covered with a uniform conductive layer corresponding for example to a small-chip size or an intermediate size.

The invention is particularly useful in the case where it will be desired that certain connection wires be drawn directly between the chip and silk-screen printed conductois further away from the chip than are the conductive regions which surround the site reserved for the chip.

Other characteristics and advantages of the invention will emerge on reading the detailed description which follows, and which is made with reference to the attached drawings in which:

FIG. 1 represents a general multi-layer ceramic case structure to which the invention can apply;

FIG. 2 represents a view of the upper face of the substrate with chip-reception site (sic) according to the invention;

FIG. 3 represents a view of the upper face of the substrate with chips positioned in the reserved sites;

FIGS. 4(a) and 4(b) schematically represent variants of the invention.

In FIG. 2 which illustrates one embodiment of the invention, is seen the upper face of the ceramic substrate 10, with three sites 23, 25, 27 each reserved for a respective chip. The references of FIG. 1 are retained in the following figures if they designate the same elements.

In the embodiment represented, the totality of the area reserved for the chip on each site is covered with a number of mutually insulated conductive contacts 42; they are made by silk-screen printing at the same time as the other conductors which can be present on the same area of ceramic.

Here the area on which the conductive contacts are silk-screen printed is the area of the upper ceramic layer of the substrate, but in other cases this could be an area of visible intermediate layer: such is the case when the upper surface has a cutout serving as housing for the chip, the chip being bonded to the back of this housing hence onto a lower layer of silk-printed ceramic.

The contacts 42 are for example rectangular or square shaped contacts; their area is sufficient for it to be possible to solder a connection wire thereto by the "wire-bonding" technique. However it is sufficiently small for a number of contacts to be able to be distributed around the chip and serve as soldering relays for one or more or all of the connection wires between the chips and the substrate. The contacts are preferably spread uniformly over the are which they occupy.

The area covered by contacts is intended to receive a bonded or soldered chip of variable size. If a chip with maximum size is positioned, the contacts are practically all covered by the chip.

The site reserved for the soldering or bonding of a monolithic chip is surrounded by conductive connection regions 44. These silk-screen printed conductive regions are intended to constitute connection wire soldering sites whose role is to connect the conductors of the substrate with the chip which may be at this site. The maximum size of the chips which can be positioned is defined by the area delimited by the conductive regions, from which a peripheral guard strip must be subtracted so that the chip is not in danger of being too close to the conductive regions 44.

The number of conductive regions 44 corresponds almost or exactly to the maximum number of contacts which the chips, which it is intended may be at the reserved sites, can comprise. If a chip having a smaller number of input/output contacts than the maximum number is used, certain conductive regions will not be used.

In the example embodiment which is described here, the input/output contacts of the chip are broken down into power-supply contacts and signal-routing contacts, and the power-supply contacts are treated differently to the others: the conductive regions situated around the sites reserved for the chip serves only as regards the signals and not as regards the power supplies. As regards the power-supply, silk-screen printed conductors 46, 48, 50 encircle the sites reserved for the chips by bordering the periphery of the substrate, in such a way that these conductors pass close to each of the chips.

The power-supply conductors 46, 48, 50 (for example an earth conductor and two supply potentials) pass around the conductive regions 44; they are therefore further from the chips than the conductive regions 44, but they are nevertheless close enough so that connection wires may be soldered directly between the chip (if it is of large size) and these conductors, without passing through conductive regions 44 and silk-screen printed conductors which would join up the peripheral supply conductors 46, 48, 50.

In FIG. 2 there has again been represented by points or small circles conductive vias allowing an inter-connection of the silk-screen printed conductors of the various ceramic layers.

In FIG. 3 has been represented the same substrate as in FIG. 2, with chips positioned at the sites 23, 25 and 27.

To better reveal the attraction of the invention, there has been represented a chip 22 of small size at the site 23, a chip 24 of large size at the site 25, and a chip 26 of average size at the site 27.

The large size chip 24 is therefore bonded or soldered to the site 25 on insulated conductive contacts deposited as an array on this site. The chip covers the major portion of these contacts. Connection wires 60 are conventionally soldered between the chip and the conductive regions 44 which surround the site 25. Certain wires 70 are soldered directly between the chip and the peripheral conductors 46, 48, 50; they are the wires corresponding to the power supply of the chip.

For the average size chip 26, it remains possible to solder connection wires between the contacts of the chip and the conductive regions 44 which surround the site 27. However it becomes impossible or dangerous to solder wires directly from the chip to the peripheral supply conductors. The conductive contacts according to the invention are therefore used to supply the chip. They serve as relay for a wire 80 which goes from the chip to the contact and which sets off again from the contact towards the desired peripheral conductor. The invention is therefore attractive since it makes easier the use of a configuration in which the supply conductors, treated separately, surround the conductive regions reserved for the routing of signals.

For the small size chip 22, at the site 23, the invention is even more attractive. In fact, in this case, the size of the chip relative to the site is such that it becomes difficult or impossible to solder wires between the chip and the conductive regions 44. A relay contact between the chip and the conductive region is therefore used for each connection wire 90. And a fortiori it is impossible to directly connect a wire of the chip to a peripheral supply conductor. Relay contacts are therefore likewise used for these connections; two relay contacts can even be used for each wire, as is represented for the wires 100, so as to approach as closely as possible the periphery of the site reserved for the chip before clearing the space which separates the site from the peripheral conductors 46, 48, 50.

In FIG. 4, there has been represented two variants of the invention. In these two variants the central area of the site reserved for the chip is not covered by insulated conductive contacts. This central area corresponds roughly to the area of the smallest chip which it is envisaged to place in the case. In the variant of FIG. 4a this central area 110 is left bare: it is an area of ceramic of the substrate. In the variant of FIG. 4b, this central area is metallised (by the same silk-screen printing which enables the contacts 42, the conductive regions 44 and the other conductors of the substrate to be made). This metallised area can moreover be connected by inter-layer vias to the other conductors of the substrate, and more precisely, in principle, to an earth conductor. This metallised area can serve as rear face contact for silicon chips.

We claim:

1. A chip-carrier for wire-bonded chips comprising a substrate having a support face including:
   at least one supporting area for receiving a rear face of a wire bondable chip, which chip has on an opposite face a majority of its input and output contacts, conductive regions surrounding said supporting area and intended to be connected to external connection pins, conductive contacts located between said conductive regions and said supporting area so as to permit to link by at least two conductive wires from one input or output contact of said chip to at least one conductive region when the dimensions of the chip are too small to authorize a reliable link with only one wire between said input an output contact and said conductive region, wherein said supporting area is covered with continuous conductive layer.

2. A chip carrier according to claim 1, wherein said substrate is a multilayer ceramic substrate having several superposed printed patterns of conductors and wherein said conductive regions, said conductive contacts and said conductive continuous layer are a part of one such printed patterns.

3. A chip carrier according to claim 2, wherein said conductive continuous layer is connected through conductive vias to at least one printed pattern of conductors.

4. A chip-carrier according to any of claims 1 to 3, wherein said conductive regions, said conductive contacts, and said conductive continuous layers are silk-screened conductive areas.

5. A chip-carrier for wire-bonded chips comprising a main support face, said face including at least one supporting area for receiving a rear face of a wire bondable chip, which chip has on an opposite face a majority of its input and output contacts, and conductive zones arranged on said support face outside said area, said face being covered at least in part with an array of numerous individual electrically conductive pads which are electrically insulated from each other, wherein said chip on said area extends over a surface substantially smaller than said entire area, so that there remains a number of surrounding pads around said chip and not covered by the chip, and wherein at least one conductive wire extends between the chip and one such surrounding pad, and another wire extends between said one surrounding pad and another surrounding pad and another wire extends between said one surrounding pad and one of said conductive zones outside said area.

6. A chip carrier according to claim 5, wherein said main supporting face is on a multilayer ceramic substrate having several superimposed printed patterns of conductors, and wherein said conductive zones are part of one such printed patterns.

7. A chip carrier according to claim 6, wherein said supporting area is covered with a continuous conductive layer, and said continuous layer is connected through conductive vias to at least one of said printed patterns.

8. A chip carrier according to any one of claims 5, 6, 7 wherein said conductive zones and said conductive pads, are silk screen conductive areas.

\* \* \* \* \*